(12) United States Patent
Xiao et al.

(10) Patent No.: US 10,586,608 B2
(45) Date of Patent: Mar. 10, 2020

(54) DRAM REFRESH METHOD, APPARATUS, AND SYSTEM

(71) Applicant: Huawei Technologies Co., Ltd., Shenzhen (CN)

(72) Inventors: Shihai Xiao, Hangzhou (CN); Yongbing Huang, Beijing (CN); Rui He, Hangzhou (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 44 days.

(21) Appl. No.: 15/802,781

(22) Filed: Nov. 3, 2017

(65) Prior Publication Data
US 2018/0053569 A1 Feb. 22, 2018

Related U.S. Application Data

(63) Continuation of application No. PCT/CN2015/078224, filed on May 4, 2015.

(51) Int. Cl.
*G11C 11/40* (2006.01)
*G11C 29/00* (2006.01)
(Continued)

(52) U.S. Cl.
CPC ........ *G11C 29/783* (2013.01); *G11C 11/4091* (2013.01); *G11C 11/40607* (2013.01); *G11C 11/40618* (2013.01)

(58) Field of Classification Search
CPC ............ G11C 29/783; G11C 11/40607; G11C 11/403; G11C 11/40618; G11C 11/40622;
(Continued)

(56) References Cited

U.S. PATENT DOCUMENTS

| 6,046,953 A | 4/2000 | Kiehl et al. |
| 6,665,224 B1 | 12/2003 | Lehmann et al. |

(Continued)

FOREIGN PATENT DOCUMENTS

| CN | 1232266 A | 10/1999 |
| CN | 1977339 A | 6/2007 |

(Continued)

OTHER PUBLICATIONS

Foreign Communication From a Counterpart Application, European Application No. 15891059.6, Extended European Search Report dated Feb. 27, 2018, 12 pages.
(Continued)

*Primary Examiner* — Mohammed A Bashar
(74) *Attorney, Agent, or Firm* — Conley Rose, P.C.

(57) ABSTRACT

A dynamic random access memory (DRAM) refresh method in which a to-be-refreshed area in a refresh block is specified in a refresh instruction is provided to refresh a specified location of a DRAM storage array. A memory controller sends a refresh instruction to a DRAM refresh apparatus. The refresh instruction includes an identifier of a to-be-refreshed block and refresh information indicating a to-be-refreshed area. The DRAM refresh apparatus generates addresses of to-be-refreshed bank rows in the to-be-refreshed block according to the identifier and the refresh information, and refresh locations corresponding to the addresses of the bank rows in the to-be-refreshed block. Therefore, a DRAM refresh time is shortened, refresh power consumption is reduced, a refresh operation is more flexible, and system resource consumption is reduced while data integrity is ensured.

20 Claims, 9 Drawing Sheets

(51) Int. Cl.
*G11C 11/406* (2006.01)
*G11C 11/4091* (2006.01)

(58) Field of Classification Search
CPC ........... G11C 11/40611; G11C 11/4091; G11C 11/406
See application file for complete search history.

(56) References Cited

U.S. PATENT DOCUMENTS

| | | |
|---|---|---|
| 7,428,687 B2 | 9/2008 | Klein |
| 8,750,086 B2 | 6/2014 | Wang et al. |
| 2002/0141267 A1* | 10/2002 | Choi ............... G11C 11/406 365/222 |
| 2002/0191467 A1 | 12/2002 | Matsumoto et al. |
| 2003/0081483 A1* | 5/2003 | De Paor ............ G11C 7/1018 365/222 |
| 2005/0265102 A1 | 12/2005 | Remaklus, Jr. et al. |
| 2008/0049532 A1 | 2/2008 | Kajigaya |
| 2008/0144418 A1 | 6/2008 | Oh |
| 2009/0083479 A1* | 3/2009 | Lee .................. G11C 7/1075 711/106 |
| 2011/0131371 A1 | 6/2011 | Sun et al. |
| 2013/0254475 A1* | 9/2013 | Perego ............ G11C 11/40603 711/106 |
| 2014/0016422 A1 | 1/2014 | Kim et al. |
| 2014/0064008 A1 | 3/2014 | Lee |
| 2014/0177371 A1 | 6/2014 | Ellis et al. |

FOREIGN PATENT DOCUMENTS

| | | |
|---|---|---|
| CN | 101300641 A | 11/2008 |
| CN | 102081964 A | 6/2011 |
| CN | 103187091 A | 7/2013 |
| CN | 104239220 A | 12/2014 |
| EP | 0955640 A2 | 11/1999 |

OTHER PUBLICATIONS

Machine Translation and Abstract of Chinese Publication No. CN104239220, Dec. 24, 2014, 20 pages.
Cui, Z., et al., "DTail: A Flexible Approach to DRAM Refresh Management," ICS'14, Jun. 10-13, 2014. pp. 43-52.
Liu, J., et al., "RAIDR: Retention-Aware Intelligent DRAM Refresh," International Symposium on Computer Architecture, 2012, 12 pages.
Foreign Communication From a Counterpart Application, PCT Application No. PCT/CN2015/078224, English Translations of International Search Report dated Feb. 4, 2016, 2 pages.
Foreign Communication From a Counterpart Application, PCT Application No. PCT/CN2015/078224, English Translations of Written Opinion dated Feb. 4, 2016, 7 pages.
Machine Translation and Abstract of Chinese Publication No. CN103187091, Jul. 3, 2013, 6 pages.
Foreign Communication From a Counterpart Application, Chinese Application No. 201580001215.8, Chinese Office Action dated Aug. 27, 2019, 12 pages.
Foreign Communication From a Counterpart Application, Chinese Application No. 201580001215.8, Chinese Search Report dated Aug. 20, 2019, 2 pages.

* cited by examiner

DRAM REFRESH METHOD, APPARATUS, AND SYSTEM

CROSS-REFERENCE TO RELATED APPLICATIONS

This application is a continuation of International Patent Application No. PCT/CN2015/078224 filed on May 4, 2015, which is hereby incorporated by reference in its entirety.

TECHNICAL FIELD

Embodiments of the present disclosure relate to the memory field, and in particular, to a dynamic random access memory (DRAM) refresh method, apparatus, and system.

BACKGROUND

Nowadays, a main memory of a computer mainly uses a DRAM storage technology. A DRAM storage unit represents a data bit according to whether a capacitor stores electricity. Electricity stored in the capacitor leaks with time, such that the data bit changes. Therefore, for a DRAM, a capacitor storing data needs to be periodically refreshed in order to ensure integrity of memory data.

A refresh time interval of each DRAM unit needs to meet a DRAM standard, and a specific refresh time interval of each DRAM unit depends on a type and an operating temperature of a DRAM. When the DRAM is being refreshed, a system time is occupied and a large power consumption is caused. This goes against a current demand for a computer with a higher processing speed and lower power consumption.

As integration density of an integrated circuit increases, a storage unit of a DRAM becomes larger in scale, and DRAM refresh delay and power consumption problems become increasingly serious.

SUMMARY

In view of the above, embodiments of the present disclosure provide a DRAM refresh method, apparatus, and system in order to refresh a specified location of a DRAM storage array. A to-be-refreshed area of a to-be-refreshed DRAM storage array may be specified in a refresh instruction.

According to a first aspect, an embodiment of the present disclosure provides a DRAM refresh method, where a DRAM storage array includes at least two banks, a row of the DRAM storage array includes bank rows corresponding to the at least two banks, the DRAM storage array is divided into at least two refresh blocks, each block includes at least two rows of the DRAM storage array, and the method includes receiving, by a DRAM refresh apparatus, a refresh instruction from a memory controller, where the refresh instruction includes an identifier of a to-be-refreshed block and refresh information used to indicate a to-be-refreshed area, and the refresh instruction is used to instruct the DRAM refresh apparatus to refresh the to-be-refreshed area in the to-be-refreshed block, generating, by the DRAM refresh apparatus, addresses of to-be-refreshed bank rows in the to-be-refreshed block according to the identifier and the refresh information, and refreshing, by the DRAM refresh apparatus, locations corresponding to the addresses of the bank rows in the to-be-refreshed block.

With reference to the first aspect, in a first possible implementation manner, the refresh information includes first indication information and second indication information, where the first indication information is used to indicate a to-be-refreshed block row in the to-be-refreshed block, and the second indication information is used to indicate a to-be-refreshed bank row.

With reference to either the first aspect or the foregoing possible implementation manner, in a second possible implementation manner, refreshing, by the DRAM refresh apparatus, locations corresponding to the addresses of the bank rows in the to-be-refreshed block includes refreshing, by the DRAM refresh apparatus in N refresh stages according to a quantity M of to-be-refreshed block rows in the to-be-refreshed block, the locations corresponding to the addresses of the bank rows, where locations, in a same block row, of the locations are refreshed in parallel in a same refresh stage, M is a positive integer greater than 0, and N is a positive integer greater than 0 and less than or equal to M.

With reference to any one of the first aspect or the foregoing possible implementation manners, in a third possible implementation manner, the refresh information further includes a row combination identifier used to instruct the DRAM refresh apparatus to refresh at least two block rows in the to-be-refreshed block in a same refresh stage, and N is less than M.

With reference to any one of the first aspect or the foregoing possible implementation manners, in a fourth possible implementation manner, the refresh information further includes a termination identifier, and the termination identifier is used to instruct the DRAM refresh apparatus to terminate refreshing of the to-be-refreshed block after the indicated block row is refreshed, and the method further includes terminating, by the DRAM refresh apparatus, the refreshing of the to-be-refreshed block according to the termination identifier.

With reference to any one of the first aspect or the foregoing possible implementation manners, in a fifth possible implementation manner, the refresh information further includes a suspension identifier, and the suspension identifier is used to instruct the DRAM refresh apparatus to suspend refreshing of the to-be-refreshed block after the indicated block row is refreshed, and the method further includes suspending, by the DRAM refresh apparatus, the refreshing of the to-be-refreshed block according to the suspension identifier.

With reference to any one of the first aspect or the foregoing possible implementation manners, in a sixth possible implementation manner, the method further includes resuming, by the DRAM refresh apparatus, the suspended refreshing of the to-be-refreshed block, and continuing to refresh a remaining to-be-refreshed block row.

According to a second aspect, an embodiment of the present disclosure provides a DRAM refresh method, where a DRAM storage array includes at least two banks, a row of the DRAM storage array includes bank rows corresponding to the at least two banks, the DRAM storage array is divided into at least two refresh blocks, each block includes at least two rows of the DRAM storage array, and the method includes determining, by a memory controller, a to-be-refreshed block and a to-be-refreshed area in the to-be-refreshed block, and sending, by the memory controller, a refresh instruction to a DRAM refresh apparatus, where the refresh instruction includes an identifier of the to-be-refreshed block and refresh information used to indicate the to-be-refreshed area.

With reference to the second aspect, in a first possible implementation manner, the refresh information includes first indication information and second indication information, where the first indication information is used to indicate a to-be-refreshed block row in the to-be-refreshed block, and the second indication information is used to indicate a to-be-refreshed bank row.

With reference to either the second aspect or the foregoing possible implementation manner, in a second possible implementation manner, the refresh information further includes a row combination identifier used to instruct the DRAM refresh apparatus to refresh, in parallel, at least two block rows in the to-be-refreshed block in a same refresh stage.

With reference to any one of the second aspect or the foregoing possible implementation manners, in a third possible implementation manner, the refresh information further includes a termination identifier, and the termination identifier is used to instruct the DRAM refresh apparatus to terminate refreshing of the to-be-refreshed block after the indicated block row is refreshed.

With reference to any one of the second aspect or the foregoing possible implementation manners, in a fourth possible implementation manner, the refresh information further includes a suspension identifier, and the suspension identifier is used to instruct the DRAM refresh apparatus to suspend refreshing of the to-be-refreshed block after the indicated block row is refreshed.

According to a third aspect, an embodiment of the present disclosure provides a DRAM refresh apparatus, where a DRAM storage array includes at least two banks, a row of the DRAM storage array includes bank rows corresponding to the at least two banks, the DRAM storage array is divided into at least two refresh blocks, each block includes at least two rows of the DRAM storage array, and the apparatus includes a receiving unit configured to receive a refresh instruction from a memory controller, where the refresh instruction includes an identifier of a to-be-refreshed block and refresh information used to indicate a to-be-refreshed area, and the refresh instruction is used to instruct the DRAM refresh apparatus to refresh the to-be-refreshed area in the to-be-refreshed block, a generation module configured to generate addresses of to-be-refreshed bank rows in the to-be-refreshed block according to the identifier and the refresh information, and a refresh unit configured to refresh locations corresponding to the addresses of the bank rows in the to-be-refreshed block.

With reference to the third aspect, in a first possible implementation manner, the refresh information includes first indication information and second indication information, where the first indication information is used to indicate a to-be-refreshed block row in the to-be-refreshed block, and the second indication information is used to indicate a to-be-refreshed bank row.

With reference to either the third aspect or the foregoing possible implementation manner, in a second possible implementation manner, when refreshing the locations corresponding to the addresses of the bank rows in the to-be-refreshed block, the refresh unit refreshes, in N refresh stages according to a quantity M of to-be-refreshed block rows in the to-be-refreshed block, the locations corresponding to the addresses of the bank rows, where locations, in a same block row, of the locations are refreshed in parallel in a same refresh stage, M is a positive integer greater than 0, and N is a positive integer greater than 0 and less than or equal to M.

With reference to any one of the third aspect or the foregoing possible implementation manners, in a third possible implementation manner, the refresh information further includes a row combination identifier used to instruct the refresh unit to refresh at least two block rows in the to-be-refreshed block in a same refresh stage, and N is less than M.

With reference to any one of the third aspect or the foregoing possible implementation manners, in a fourth possible implementation manner, the refresh information further includes a termination identifier, and the termination identifier is used to instruct the refresh unit to terminate refreshing of the to-be-refreshed block after the indicated block row is refreshed, and the refresh unit is further configured to terminate the refreshing of the to-be-refreshed block according to the termination identifier.

With reference to any one of the third aspect or the foregoing possible implementation manners, in a fifth possible implementation manner, the refresh information further includes a suspension identifier, and the suspension identifier is used to instruct the refresh unit to suspend refreshing of the to-be-refreshed block after the indicated block row is refreshed, and the refresh unit is further configured to suspend the refreshing of the to-be-refreshed block according to the suspension identifier.

With reference to any one of the third aspect or the foregoing possible implementation manners, in a sixth possible implementation manner, the refresh unit is further configured to resume the suspended refreshing of the to-be-refreshed block, and continue to refresh a remaining to-be-refreshed block row.

According to a fourth aspect, an embodiment of the present disclosure provides a DRAM chip, including a DRAM storage array and the DRAM refresh apparatus according to any one of the third aspect or possible implementation manners of the third aspect, where the DRAM refresh apparatus is configured to refresh the DRAM storage array.

According to a fifth aspect, an embodiment of the present disclosure provides a DRAM refresh control apparatus, where a DRAM storage array includes at least two banks, a row of the DRAM storage array includes bank rows corresponding to the at least two banks, the DRAM storage array is divided into at least two refresh blocks, each block includes at least two rows of the DRAM storage array, and the apparatus includes a determining unit configured to determine a to-be-refreshed block and a to-be-refreshed area in the to-be-refreshed block, and a sending unit configured to send a refresh instruction to a DRAM refresh apparatus, where the refresh instruction includes an identifier of the to-be-refreshed block and refresh information used to indicate the to-be-refreshed area.

With reference to the fifth aspect, in a first possible implementation manner, the refresh information includes first indication information and second indication information, where the first indication information is used to indicate a to-be-refreshed block row in the to-be-refreshed block, and the second indication information is used to indicate a to-be-refreshed bank row.

With reference to either the fifth aspect or the foregoing possible implementation manner, in a second possible implementation manner, the refresh information further includes a row combination identifier used to instruct the DRAM refresh apparatus to refresh, in parallel, at least two block rows in the to-be-refreshed block in a same refresh stage.

With reference to any one of the fifth aspect or the foregoing possible implementation manners, in a third possible implementation manner, the refresh information further includes a termination identifier, and the termination identifier is used to instruct the DRAM refresh apparatus to terminate refreshing of the to-be-refreshed block after the indicated block row is refreshed.

With reference to any one of the fifth aspect or the foregoing possible implementation manners, in a fourth possible implementation manner, the refresh information further includes a suspension identifier, and the suspension identifier is used to instruct the DRAM refresh apparatus to suspend refreshing of the to-be-refreshed block after the indicated block row is refreshed.

According to a sixth aspect, an embodiment of the present disclosure provides a DRAM refresh system, including a DRAM refresh control apparatus, a DRAM refresh apparatus, and a DRAM storage array, where the DRAM storage array includes at least two banks, a row of the DRAM storage array includes bank rows corresponding to the at least two banks, the DRAM storage array is divided into at least two refresh blocks, and each block includes at least two rows of the DRAM storage array. The DRAM refresh control apparatus is configured to determine a to-be-refreshed block and a to-be-refreshed area in the to-be-refreshed block, and send a refresh instruction to the DRAM refresh apparatus, where the refresh instruction includes an identifier of the to-be-refreshed block and refresh information used to indicate the to-be-refreshed area, and the DRAM refresh apparatus is configured to generate addresses of to-be-refreshed bank rows in the to-be-refreshed block according to the identifier and the refresh information, and refresh locations corresponding to the addresses of the bank rows in the to-be-refreshed block.

With reference to the sixth aspect, in a first possible implementation manner, the refresh information includes first indication information and second indication information, where the first indication information is used to indicate a to-be-refreshed block row in the to-be-refreshed block, and the second indication information is used to indicate a to-be-refreshed bank row.

With reference to either the sixth aspect or the foregoing possible implementation manner, in a second possible implementation manner, that the DRAM refresh apparatus refreshes locations corresponding to the addresses of the bank rows in the to-be-refreshed block includes the DRAM refresh apparatus refreshes, in N refresh stages according to a quantity M of to-be-refreshed block rows in the to-be-refreshed block, the locations corresponding to the addresses of the bank rows, where locations, in a same block row, of the locations are refreshed in parallel in a same refresh stage, M is a positive integer greater than 0, and N is a positive integer greater than 0 and less than or equal to M.

With reference to any one of the sixth aspect or the foregoing possible implementation manners, in a third possible implementation manner, the refresh information further includes a row combination identifier used to instruct the DRAM refresh apparatus to refresh at least two block rows in the to-be-refreshed block in a same refresh stage, and N is less than M.

With reference to any one of the sixth aspect or the foregoing possible implementation manners, in a fourth possible implementation manner, the refresh information further includes a termination identifier, and the termination identifier is used to instruct the DRAM refresh apparatus to terminate refreshing of the to-be-refreshed block after the indicated block row is refreshed, and the DRAM refresh apparatus is further configured to terminate the refreshing of the to-be-refreshed block according to the termination identifier.

With reference to any one of the sixth aspect or the foregoing possible implementation manners, in a fifth possible implementation manner, the refresh information further includes a suspension identifier, and the suspension identifier is used to instruct the DRAM refresh apparatus to suspend refreshing of the to-be-refreshed block after the indicated block row is refreshed, and the DRAM refresh apparatus is further configured to suspend the refreshing of the to-be-refreshed block according to the suspension identifier.

With reference to any one of the sixth aspect or the foregoing possible implementation manners, in a sixth possible implementation manner, the DRAM refresh apparatus is further configured to resume the suspended refreshing of the to-be-refreshed block, and continue to refresh a remaining to-be-refreshed block row.

According to the technical solutions provided in the embodiments of the present disclosure, a memory controller can refresh a specified location of a DRAM storage array. Therefore, a DRAM refresh operation can be more properly configured, a DRAM refresh time is shortened, refresh power consumption is reduced, a refresh operation is more flexible, and system resource consumption is reduced while data integrity is ensured.

BRIEF DESCRIPTION OF DRAWINGS

To describe the technical solutions in the embodiments of the present disclosure more clearly, the following briefly describes the accompanying drawings required for describing the embodiments. The accompanying drawings in the following description show only some embodiments of the present disclosure, and persons of ordinary skill in the art may still derive other drawings from these accompanying drawings without creative efforts.

DESCRIPTION OF EMBODIMENTS

The following clearly describes the technical solutions in the embodiments of the present disclosure with reference to the accompanying drawings in the embodiments of the present disclosure. The described embodiments are merely some but not all of the embodiments of the present disclosure. All other embodiments obtained by persons of ordinary skill in the art based on the embodiments of the present disclosure without creative efforts shall fall within the protection scope of the present disclosure.

Figure 1:
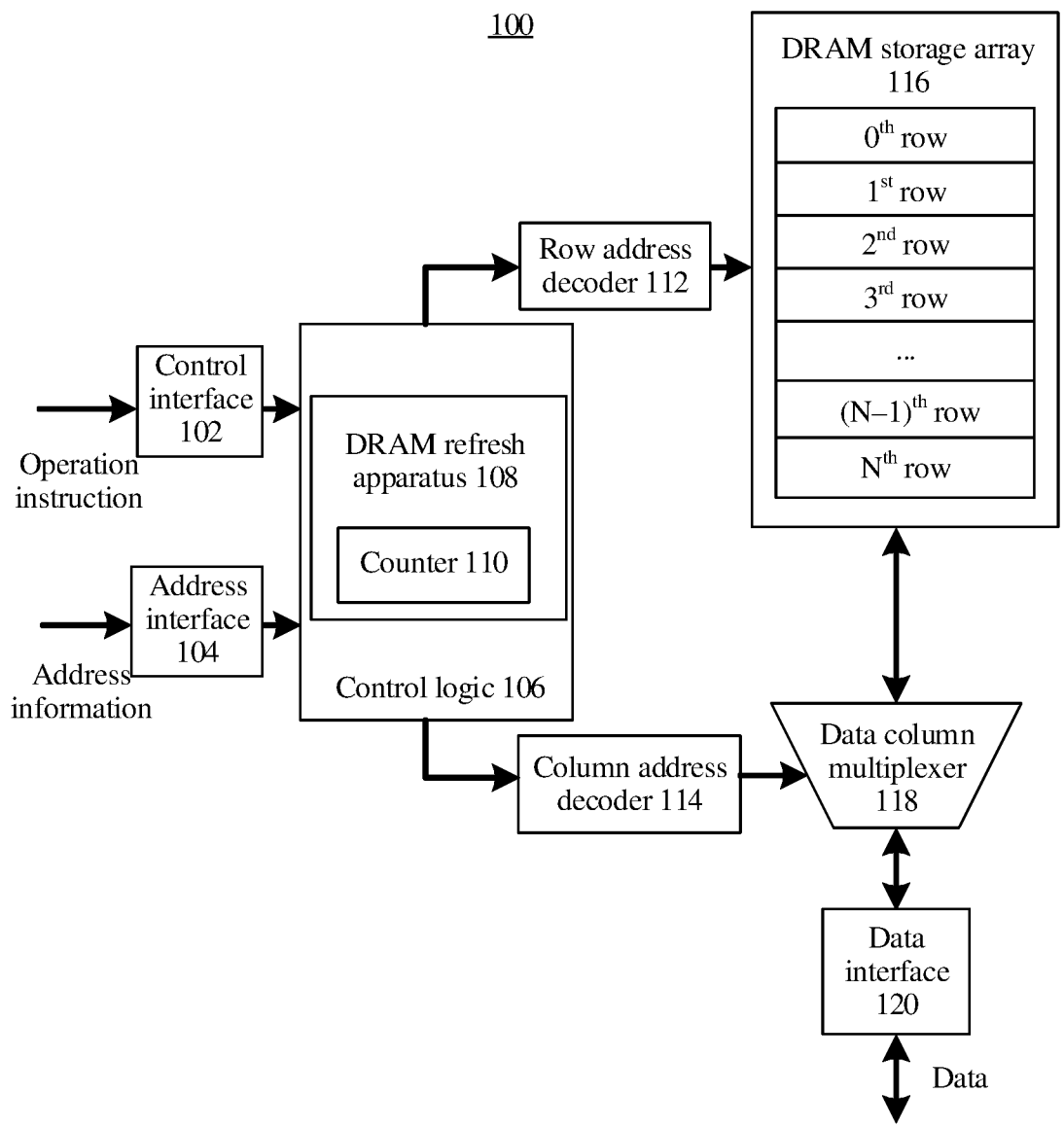
FIG. 1 is a block diagram of a DRAM refresh system.

FIG. 1 is a simplified block diagram of a DRAM refresh system 100 according to an embodiment of the present disclosure. As shown in FIG. 1, the DRAM refresh system 100 includes a DRAM storage array 116, control logic 106, a row address decoder 112, a column address decoder 114, a data column multiplexer 118, a control interface 102, an address interface 104, and a data interface 120. FIG. 1 provides only a relatively simplified DRAM refresh system, and the DRAM refresh system 100 is only an example of a DRAM refresh system. The DRAM refresh system 100 may include components more or fewer than those shown in FIG. 1, or have a different component configuration manner. Various components shown in FIG. 1 may be implemented using hardware, software, or a combination of hardware and software.

For ease of description, the DRAM storage array 116 shown in FIG. 1 shows only a simple bank in one-dimensional distribution (i.e., only one set of rows: $0^{th}$ row, $1^{st}$ row, $2^{nd}$ row, $3^{rd}$ row, . . . , $(N-1)^{th}$ row, and $N^{th}$ row with one column), but persons skilled in the art may understand that the DRAM storage array 116 may be implemented in multiple manners. For example, the DRAM storage array 116 has at least two banks, or a storage array is configured to implement functions equivalent to those implemented by at least two banks. Each bank of the DRAM storage array 116 has apparatuses such as a row address decoder 112, a column address decoder 114, and a data column multiplexer 118.

The control interface 102, the address interface 104, and the data interface 120 jointly provide a communications interface between the DRAM refresh system 100 and a peripheral device (not shown) of the DRAM refresh system 100. The DRAM refresh system 100 receives, using the control interface 102 coupled to the control logic 106, an operation instruction used to instruct to perform a read operation, a write operation, or another operation on the DRAM storage array 116.

The DRAM refresh system 100 receives address information using the address interface 104 coupled to the control logic 106. The address information is used to instruct to perform a read operation, a write operation, or another operation on one specific storage unit or some specific storage units of the DRAM storage array 116. Using the data interface 120 coupled to at least the data column multiplexer 118, the DRAM refresh system 100 transmits data stored in the DRAM storage array 116 to an external device, or receives data from the external device and stores the data in the DRAM storage array 116.

The control logic 106 is configured to control and execute, with reference to (or without reference to) the address information and/or other information that are/is received using the address interface 104, the operation instruction received from the control interface 102. Storage units of the DRAM storage array 116 are organized together in a two-dimensional manner, a row and a column. Therefore, the control logic 106 transmits a row address to the row address decoder 112 and transmits a column address to the column address decoder 114 in order to perform a read operation, a write operation, or another operation on some storage units of the DRAM storage array 116. The row address decoder 112 and the column address decoder 114 are separately coupled to the control logic 106. The row address decoder 112 decodes the row address received from the control logic 106, and selects, using a decoded row address, a row of storage units of the DRAM storage array 116 for access. Similarly, the column address decoder 114 decodes the column address received from the control logic 106, and controls, using a decoded column address, the data column multiplexer 118 (the data column multiplexer 118 is coupled to the column address decoder 114) to select, from the row selected by the row address decoder 112, one storage unit (or some storage units) for access.

A DRAM refresh apparatus 108 is a component of the control logic 106. After receiving a refresh instruction, the DRAM refresh apparatus 108 refreshes, according to an instruction of the refresh instruction, a storage row that is of the DRAM storage array 116 and that is indicated by the refresh instruction. In a refresh operation, the DRAM refresh apparatus 108 refreshes only a to-be-refreshed storage row indicated by the refresh instruction, and skips a storage row that is not to be refreshed in order to avoid unnecessary consumption caused by refreshing of the row that is not to be refreshed. In a refresh operation, the DRAM refresh apparatus 108 selects a to-be-refreshed row from the DRAM storage array 116 using the row address decoder 112. In a refresh operation, specific rows of the DRAM storage array 116 that need to be refreshed and specific rows of the DRAM storage array 116 that do not need to be refreshed are specified in the refresh instruction. The refresh instruction is sent by an external device (not shown) coupled to the DRAM refresh system 100.

In an embodiment of the present disclosure, a refresh operation is completed using the following step. The DRAM refresh system 100 receives a refresh instruction using the control interface 102 and the address interface 104. Information transferred using the control interface 102 is used to indicate that the instruction is a refresh instruction, and information transferred using the address interface 104 is used to indicate information about a location that needs to be refreshed. The refresh instruction is used to instruct to refresh one or more rows of storage units of the DRAM storage array 116.

Optionally, the DRAM refresh system 100 receives a refresh instruction using the address interface 104, and the DRAM refresh system 100 determines, according to a refresh instruction form, that the instruction is a refresh instruction. The refresh instruction is used to indicate information about a location that needs to be refreshed, and the refresh instruction instructs to refresh one or more rows of storage units of the DRAM storage array 116.

Optionally, the DRAM refresh system 100 may further receive a refresh instruction using another channel or bus interface (not shown in FIG. 1). This is not limited in this embodiment of the present disclosure.

In another operation mode, a counter 110 generates address information and sends the generated address information to the DRAM refresh apparatus 108. The control logic refreshes all rows indicated by the address information. The counter 110 performs an increasing operation, and instructs to refresh another part of storage rows in a next period.

Figure 2:
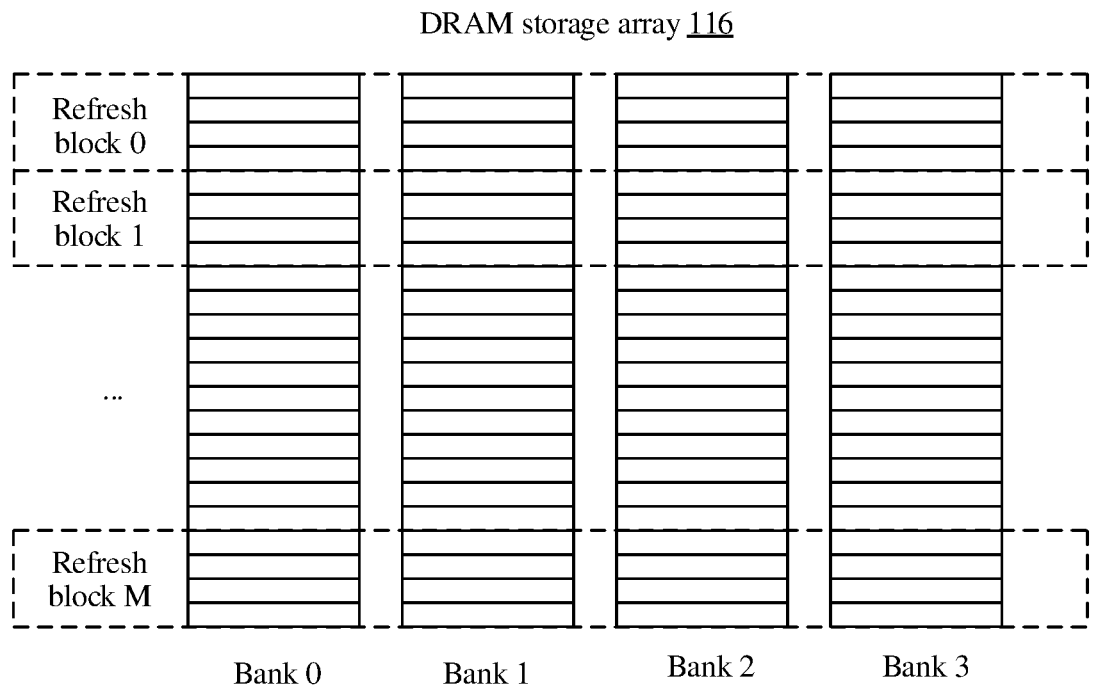
FIG. 2 is a schematic structural diagram of a DRAM storage array of the present disclosure.

Based on FIG. 1, FIG. 2 is another organization form of the DRAM storage array 116 according to an embodiment of the present disclosure. As shown in FIG. 2, the DRAM storage array 116 includes at least two banks, and is formed by logically and horizontally arranging the at least two banks. For ease of description, in FIG. 2, an example of four banks is used for description, but this embodiment of the present disclosure is not limited thereto. The DRAM storage array 116 may include more or fewer banks. The four banks included in the DRAM storage array 116 are arranged in a two-dimensional manner. The first row of the DRAM storage array 116 includes the first row of a bank 0, the first row of a bank 1, the first row of a bank 2, and the first row of a bank 3, the second row of the DRAM storage array 116 includes the second row of the bank 0, the second row of the bank 1, the second row of the bank 2, and the second row of the bank 3, and so on.

The DRAM storage array 116 is divided into at least two refresh blocks (designated as refresh block 0, refresh block 1, ..., and refresh block M). As shown in FIG. 2, the refresh blocks include multiple rows of the DRAM storage array 116. For ease of description, in FIG. 2, one refresh block includes four rows of the DRAM storage array 116, but the present disclosure is not limited thereto. One refresh block may include more or fewer storage rows of the DRAM storage array 116. Each refresh block has an address identifier. The DRAM refresh system 100 refreshes the DRAM storage array 116 in units of refresh blocks. A refresh instruction received by the DRAM refresh apparatus 108 from a memory controller coupled to the DRAM refresh system 100 includes the address identifier of the refresh block. Optionally, the address identifier of the refresh block may be indicated by an address of the first bank row in the first row of the refresh block.

Figure 3:
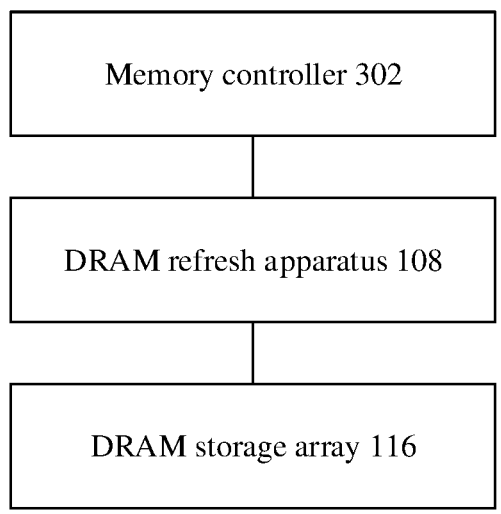
FIG. 3 is a schematic structural diagram of a DRAM refresh system according to an embodiment of the present disclosure.

FIG. 3 is a schematic structural diagram of a DRAM refresh system 300 according to an embodiment of the present disclosure. As shown in FIG. 3, the DRAM refresh system 300 includes a memory controller 302, a DRAM refresh apparatus 108, and a DRAM storage array 116. The DRAM storage array 116 is formed by logically and horizontally arranging at least two banks. A row of the DRAM storage array 116 includes bank rows corresponding to the at least two banks. The DRAM storage array 116 is divided into at least two refresh blocks, and each block includes at least two rows of the DRAM storage array 116.

The memory controller 302 maintains refresh-operation-related information of the DRAM storage array 116, and is configured to determine a to-be-refreshed block and a to-be-refreshed area in the to-be-refreshed block according to the refresh-operation-related information. The to-be-refreshed area includes a to-be-refreshed block row in the to-be-refreshed block, and to-be-refreshed bank rows in the to-be-refreshed block row.

The memory controller 302 is further configured to generate a refresh instruction. The refresh instruction includes an identifier of the to-be-refreshed block and refresh information used to indicate the to-be-refreshed area. The refresh instruction is used to instruct the DRAM refresh apparatus 108 to refresh the to-be-refreshed area in the to-be-refreshed block.

Optionally, the refresh-operation-related information includes whether a storage unit of the DRAM storage array 116 stores data and/or a keeping time of a storage unit. A DRAM storage unit without data may not be refreshed, a DRAM storage unit with a long keeping time may be refreshed at a relatively low refresh frequency, and a DRAM storage unit with a short keeping time may be refreshed at a relatively high refresh frequency. Therefore, a DRAM refresh operation can be more properly configured, a DRAM refresh time is shortened, refresh power consumption is reduced, a refresh operation is more flexible, and system resource consumption is reduced while data integrity is ensured.

After generating the refresh instruction, the memory controller 302 sends the generated refresh instruction to the DRAM refresh apparatus 108. After receiving the refresh instruction from the memory controller 302, the DRAM refresh apparatus 108 generates addresses of the to-be-refreshed bank rows in the to-be-refreshed block according to the identifier and the refresh information, and refreshes locations corresponding to the addresses of the bank rows in the to-be-refreshed block.

Optionally, the refresh information includes first indication information and second indication information. The first indication information is used to indicate the to-be-refreshed block row in the to-be-refreshed block, and the second indication information is used to indicate a to-be-refreshed bank row.

The DRAM refresh apparatus 108 may receive the refresh instruction using the control interface 102 and the address interface 104 that are shown in FIG. 1, receive an instruction identifier using the control interface 102, and receive the identifier of the block and the refresh information using the address interface 104. The instruction identifier is used to indicate that the instruction is a refresh instruction.

Figure 4:
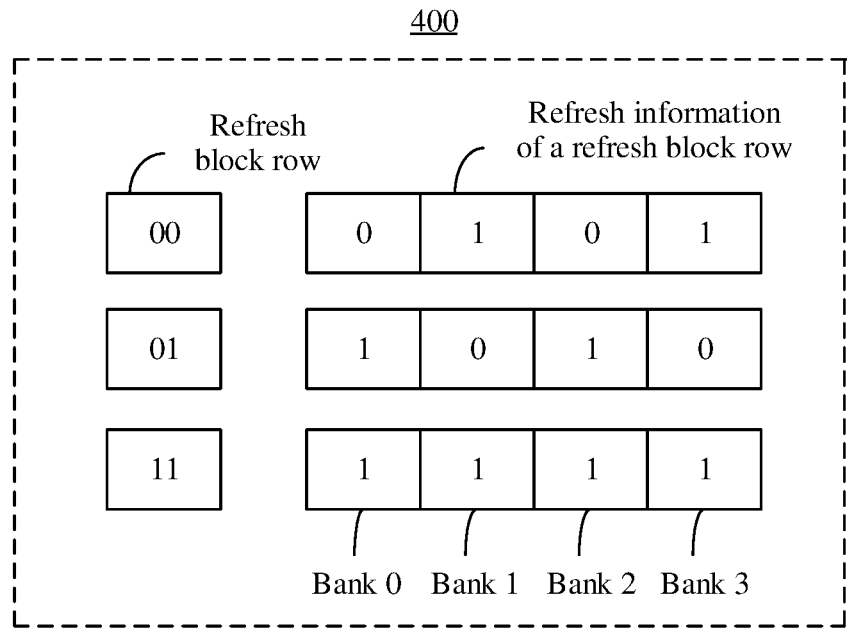
FIG. 4 is a schematic diagram of a refresh information format according to an embodiment of the present disclosure.

Optionally, a refresh information form 400 is shown in FIG. 4. The refresh information includes address identifiers of rows of the block, and information indicating specific bank rows of each block row that need to be refreshed and specific bank rows of each block row that do not need to be refreshed. As shown in FIG. 4, the embodiment in FIG. 2 is still used as a basis for description. The refresh information indicates that in the first row of the block (i.e., refresh block row 00), rows corresponding to the bank 0 and the bank 2 do not need to be refreshed (i.e., set to 0), and rows corresponding to the bank 1 and the bank 3 need to be refreshed (i.e., set to 1), and that in the second row of the block (i.e., refresh block row 01), rows corresponding to the bank 0 and the bank 2 need to be refreshed, and rows corresponding to the bank 1 and the bank 3 do not need to be refreshed. The refresh information does not include an address identifier of the third row of the block (i.e., refresh block row 10), indicating that none of bank rows in the third row of the block needs to be refreshed. In the fourth row of the block (i.e., refresh block row 11), rows corresponding to all banks need to be refreshed. FIG. 4 is only an example for describing a refresh information format, and aims to indicate the to-be-refreshed bank rows in the block. However, the refresh information format in this embodiment of the present disclosure is not limited thereto, and may have more or fewer technical features.

Figure 5:
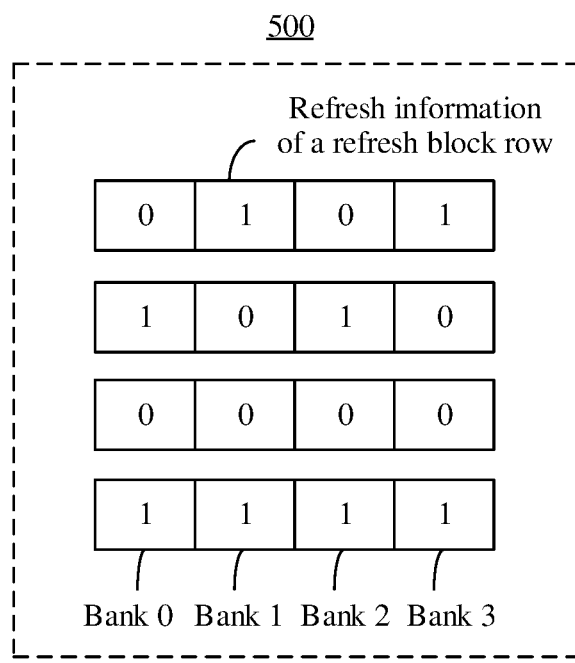
FIG. 5 is a schematic diagram of a refresh information format according to an embodiment of the present disclosure.

FIG. 5 is another refresh information form 500. To ensure that all pieces of refresh information are consistent in message format, the refresh information may use the format shown in FIG. 5. The refresh information is a logical two-dimensional array, and a structure of the refresh information is similar to that of the block. As shown in FIG. 5, the embodiment in FIG. 2 is still used as a basis for description. The refresh information indicates that in the first row of the block, rows corresponding to the bank 0 and the bank 2 do not need to be refreshed, and rows corresponding to the bank 1 and the bank 3 need to be refreshed, that in the second row of the block, rows corresponding to the bank 0 and the bank 2 need to be refreshed, and rows corresponding to the bank 1 and the bank 3 do not need to be refreshed, that in the third row of the block, none of bank rows needs to be refreshed, and that in the fourth row of the block, rows corresponding to all banks need to be refreshed. FIG. 5 is only an example for describing a refresh information format, and aims to indicate the to-be-refreshed bank rows in the block. However, the refresh information format in this embodiment of the present disclosure is not limited thereto, and may have more or fewer technical features.

As a memory capacity expands, the DRAM refresh apparatus 108 has a heavier load. According to the technical solution disclosed in this embodiment of the present disclosure, the memory controller 302 maintains refresh information, such that the DRAM storage array 116 can be selectively refreshed. A bank row without data may not be refreshed, and a refresh operation time interval of a storage unit with a long keeping time may be increased in order to greatly reduce power consumption and performance overheads of memory refresh. In addition, the DRAM storage array 116 is divided into at least two blocks, such that at least two to-be-refreshed bank rows can be indicated at a time in a refresh instruction in order to compress a refresh instruction and reduce address bus overheads.

Optionally, that the DRAM refresh apparatus 108 refreshes locations corresponding to the addresses of the bank rows in the to-be-refreshed block includes refreshing, by the DRAM refresh apparatus 108 in N refresh stages according to a quantity M of to-be-refreshed block rows in the to-be-refreshed block, the locations corresponding to the addresses of the bank rows, where locations, in a same block row, of the locations are refreshed in parallel in a same refresh stage, M is a positive integer greater than 0, and N is a positive integer greater than 0 and less than or equal to M.

According to the refresh information described in FIG. 4 and FIG. 5, a piece of refresh information may carry refresh information of multiple rows in one block in order to compress a refresh address and relieve pressure of an address bus. In addition, the memory controller 302 may refresh a specified location of the DRAM storage array 116. Therefore, a DRAM refresh operation can be more properly configured, a DRAM refresh time is shortened, refresh power consumption is reduced, a refresh operation is more flexible, and system resource consumption is reduced while data integrity is ensured.

Figure 6:
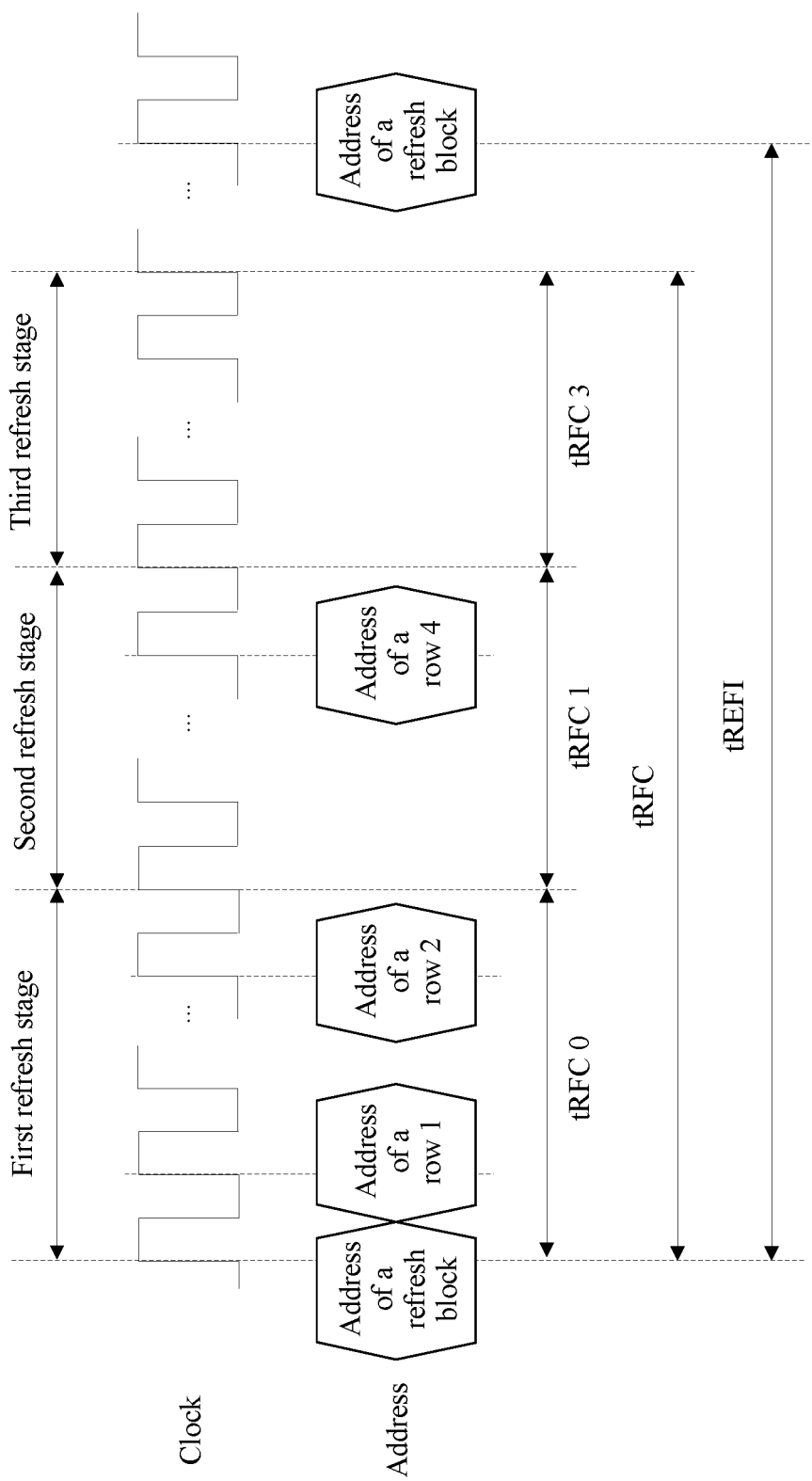
FIG. 6 is a DRAM refresh sequence diagram according to an embodiment of the present disclosure.

FIG. 6 is a DRAM refresh sequence diagram according to an embodiment of the present disclosure. For ease of description, the refresh information shown in FIG. 4 is used as an example for description in this embodiment. After receiving the refresh instruction, the DRAM refresh apparatus 108 first generates the addresses of the to-be-refreshed bank rows in the to-be-refreshed block according to the identifier of the to-be-refreshed block and the refresh information.

According to an instruction of the refresh instruction, the DRAM refresh apparatus 108 refreshes the first row of the block in a first refresh stage (i.e., refresh cycle time 0 (tRFC 0)). Further, the DRAM refresh apparatus 108 respectively sends, to row address decoders 112 of the bank 1 and the bank 3, addresses of the bank rows in the first row of the block corresponding to the bank 1 and the bank 3, and refreshes, in parallel in the first refresh stage, the bank rows in the first block row corresponding to the bank 1 and the bank 3.

Generally, refresh information of a next refresh stage may be sent before a current refresh stage is actually completed to reduce a waiting time. As shown in FIG. 6, before the first refresh stage is actually completed, the DRAM refresh apparatus 108 sends an address to be refreshed in a second refresh stage (i.e., refresh cycle time 1 (tRFC 1)), that is, the DRAM refresh apparatus 108 respectively sends, to row address decoders 112 of the bank 0 and the bank 2, addresses of the bank rows in the second row of the block corresponding to the bank 0 and the bank 2, and refreshes, in parallel in the second refresh stage, the bank rows in the second block row corresponding to the bank 0 and the bank 2.

The refresh information does not include the identifier of the third row of the block, indicating that the third block row of the block has no to-be-refreshed bank row. Therefore, the DRAM refresh apparatus 108 skips a block row that is not to be refreshed, and refreshes the fourth row of the block in a third refresh stage (i.e., refresh cycle time 3 (tRFC 3)). According to an instruction of the refresh information, all the bank rows in the fourth block row need to be refreshed. The DRAM refresh apparatus 108 sends, to row address decoders 112 corresponding to all banks, addresses of all the bank rows corresponding to the fourth row of the block, and refreshes, in parallel in the third refresh stage, all the bank rows in the fourth row of the block.

Because it takes time to enter a refresh state and exit from the refresh state, in one block, a time occupied by a first refresh stage or a last refresh stage may be slightly longer than that occupied by another refresh stage.

In another implementation manner of this embodiment of the present disclosure, the DRAM refresh apparatus 108 sends addresses of bank rows in each block row of the block to corresponding row address decoders 112, and selectively refreshes the bank rows according to the refresh information, that is, refreshes a bank row that is instructed to be refreshed, and does not refresh a bank row that is not instructed to be refreshed.

In comparison with a conventional solution that memory refresh is performed in only one stage, the memory refresh is performed in multiple refresh stages in order to ensure that a maximum of one row in one bank is refreshed in each refresh stage at the same time. According to the technical solution disclosed in this embodiment of the present disclosure, the DRAM refresh apparatus 108 may skip a block that is not to be refreshed in order to reduce a refresh time and refresh power consumption. In addition, in one refresh stage, because information about whether each bank row in a block row is refreshed is added to the refresh information, the DRAM refresh apparatus 108 may further skip a bank row, in the block row, that is not to be refreshed in order to reduce power consumption.

Optionally, the refresh information further includes a row combination identifier used to instruct the DRAM refresh apparatus 108 to refresh at least two block rows in the to-be-refreshed block in a same refresh stage, and N is less than M.

The DRAM refresh apparatus 108 is further configured to combine and refresh the at least two to-be-refreshed block rows according to an instruction of the row combination identifier, and refresh, in parallel, to-be-refreshed bank rows in the at least two to-be-refreshed block rows in one refresh stage. Further, in this embodiment, total refresh cycle time (tRFC) is equal to summation of tRFC 0, tRFC 1, and tRFC 3 and is less than the refresh interval (tREFI).

Figure 7:
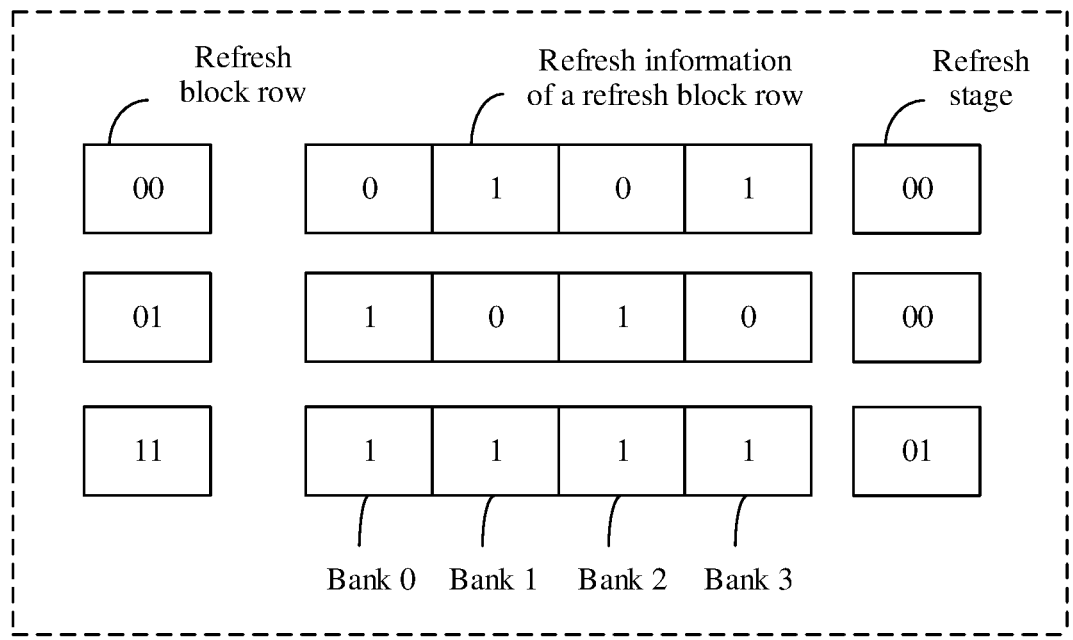
FIG. 7 is a schematic diagram of a refresh information format according to an embodiment of the present disclosure.

FIG. 7 is a refresh information form 700 according to an embodiment of the present disclosure. A refresh stage number is added based on FIG. 4, and the refresh stage number is used as a row combination identifier used to instruct the DRAM refresh apparatus 108 to combine and refresh at least two to-be-refreshed block rows. As shown in FIG. 7, because the bank rows in the first block row corresponding to the bank 1 and the bank 3 need to be refreshed, the bank rows in the second block row corresponding to the bank 0 and the bank 2 need to be refreshed, and banks in which the to-be-refreshed bank rows in the first block row are located do not overlap banks in which the to-be-refreshed bank rows in the second block row are located, the two block rows may be combined and then refreshed. The first row and the second row of the block are refreshed in parallel in a first refresh stage according to an instruction of the refresh stage number. FIG. 7 is only an example for describing a refresh information format with a row combination identifier. However, the refresh information format in this embodiment of the present disclosure is not limited thereto, and may have more or fewer technical features, or may be represented in another manner.

Figure 8:
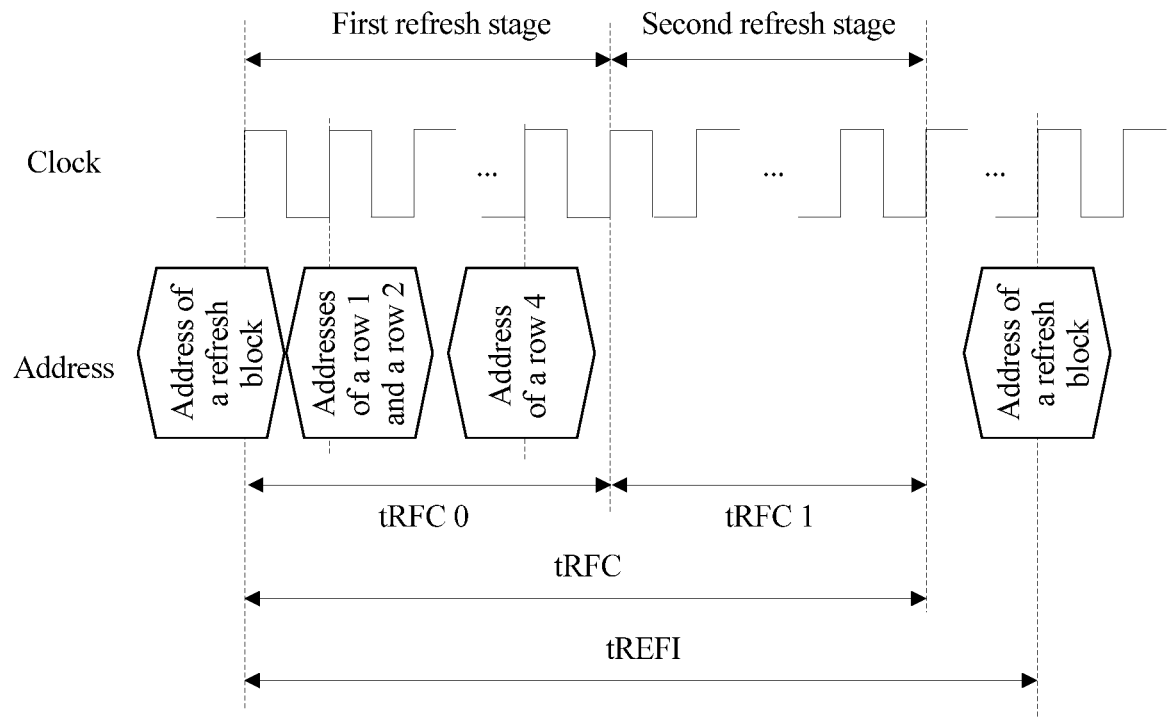
FIG. 8 is a DRAM refresh sequence diagram according to an embodiment of the present disclosure.

A DRAM refresh sequence diagram corresponding to FIG. 7 is shown in FIG. 8. After receiving, from the memory controller 302, a refresh instruction carrying the refresh information shown in FIG. 7, the DRAM refresh apparatus 108 first generates addresses of to-be-refreshed bank rows according to a block identifier and the refresh information that are carried in the refresh instruction. According to an instruction of the refresh information, in a first refresh stage (i.e., tRFC 0), the DRAM refresh apparatus respectively sends, to row address decoders 112 of the bank 1 and the bank 3, addresses of the bank rows that are in the first block row and that are corresponding to the bank 1 and the bank 3, and respectively sends, to row address decoders 112 of the bank 0 and the bank 2, addresses of the bank rows that are in the first block row and that are corresponding to the bank 0 and the bank 2, and completes refreshing of the first block row and the second block row in the first refresh stage. The refresh information does not include the identifier of the third block row, indicating that none of bank rows in the third block row needs to be refreshed in this refresh operation. Therefore, the DRAM refresh apparatus 108 skips the third block row, and refreshes the fourth block row. Similarly, to reduce a waiting time, before the first refresh stage is actually completed, addresses of to-be-refreshed bank rows in the fourth block row may be sent to corresponding row address decoders 112. That is, in this embodiment, addresses of bank rows that are in the fourth block row and that are corresponding to the bank 0, the bank 1, the bank 2, and the bank 3 are respectively sent to the row address decoders 112 of the bank 0, the bank 1, the bank 2, and the bank 3, and refreshing of the fourth block row is completed in a second refresh stage (i.e., tRFC 1).

The row combination identifier is added to the refresh information, such that at least two block rows whose to-be-refreshed bank rows are corresponding to banks that do not overlap can be combined and refreshed in order to reduce refresh stages, and reduce power consumption of a refresh operation and a delay of the refresh operation.

Optionally, the refresh information further includes a termination identifier, and the termination identifier is used to instruct to terminate refreshing of the to-be-refreshed block after an indicated refresh stage ends. The DRAM refresh apparatus 108 is further configured to terminate the refreshing of the to-be-refreshed block according to the termination identifier after the indicated refresh stage ends.

The memory controller 302 controls a refresh operation and a read/write operation on the DRAM storage array 116, and makes a unified time plan for operations on the DRAM storage array 116. Because a priority of the read/write operation is usually higher than that of the refresh operation, the memory controller 302 may flexibly plan the operations on the DRAM storage array 116, that is, may terminate refreshing of the DRAM storage array 116 after a refresh stage in a block refresh process ends, and save clock cycles for read/write operation.

In a specific implementation process, the memory controller 302 may add, after a refresh stage, the termination identifier to the refresh information of the refresh instruction. The DRAM refresh apparatus 108 terminates the refreshing of the block according to the termination identifier after the indicated refresh stage ends in order to save clock cycles for read/write operation on the DRAM. After the read/write operation ends, the memory controller 302 may send a new refresh instruction to the DRAM refresh apparatus 108 to instruct to refresh a remaining block row that is not refreshed.

According to the technical solution disclosed in this embodiment of the present disclosure, when a block is being refreshed, refreshing of the block may be terminated in advance after a refresh stage ends, such that a memory can be normally accessed. After a read/write operation ends, the memory controller 302 sends, to the DRAM refresh apparatus 108, a new refresh instruction instructing to refresh a block row that is of the block and that is not refreshed.

In another possible implementation manner of this embodiment of the present disclosure, the refresh information further includes a suspension identifier, and the suspension identifier is used to instruct to suspend refreshing of the to-be-refreshed block after an indicated refresh stage ends. The DRAM refresh apparatus 108 is further configured to suspend the refreshing of the to-be-refreshed block according to an instruction of the suspension identifier after the indicated refresh stage ends.

The DRAM refresh apparatus 108 is further configured to resume the suspended refreshing of the to-be-refreshed block, and continue to refresh a remaining to-be-refreshed block row.

In a specific implementation process, the memory controller 302 may add, after a refresh stage, the suspension identifier to the refresh information of the refresh instruction. The DRAM refresh apparatus 108 suspends the refreshing of the block according to the suspension identifier after the indicated refresh stage ends in order to save clock cycles for read/write operation on the DRAM. After the read/write operation ends, the memory controller 302 may send, to the DRAM refresh apparatus 108, a resumption instruction instructing to resume the refreshing of the block, and refresh a remaining block row that is not refreshed. Alternatively, after waiting for a specific clock cycle, the DRAM refresh apparatus 108 may automatically resume the refreshing of the block, and refresh a remaining block row that is not refreshed.

According to the technical solution disclosed in this embodiment of the present disclosure, when a block is being refreshed, refreshing of the block may be suspended after a refresh stage ends, such that a memory can be normally accessed. After a read/write operation ends, the DRAM refresh apparatus 108 resumes the refreshing of the block, and continues to refresh a block row that is not refreshed.

Optionally, the refresh information further includes a block combination identifier. If two neighboring blocks each have relatively few to-be-refreshed bank rows, when the two blocks are being refreshed, the two blocks may be combined and refreshed.

In a specific implementation process, offsets of next blocks may be added to the refresh information in order to successively locate the next blocks. In addition, refresh information of the next blocks is added to combine and refresh two neighboring blocks. Therefore, a time of one refresh cycle is saved. Further, in this embodiment, tRFC is equal to summation of tRFC 0 and tRFC 1, and is less than the tREFI.

Figure 9:
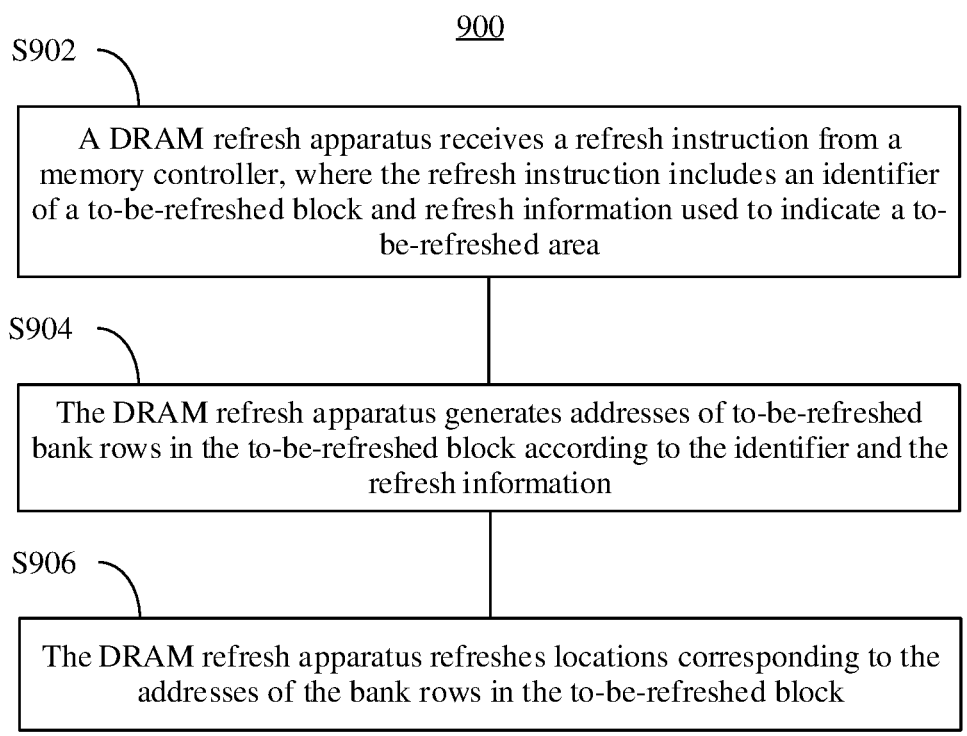
FIG. 9 is an example of a flowchart of a DRAM refresh method according to an embodiment of the present disclosure.

FIG. 9 is an example of a flowchart of a DRAM refresh method 900 according to an embodiment of the present disclosure. A DRAM storage array includes at least two banks, a row of the DRAM storage array includes bank rows corresponding to the at least two banks, the DRAM storage array is divided into at least two refresh blocks, and each block includes multiple rows of the DRAM storage array. As shown in FIG. 9, the method 900 includes the following steps.

Step S902: A DRAM refresh apparatus receives a refresh instruction from a memory controller, where the refresh instruction includes an identifier of a to-be-refreshed block and refresh information used to indicate a to-be-refreshed area. The refresh instruction is used to instruct the DRAM refresh apparatus to refresh the to-be-refreshed area in the to-be-refreshed block.

Step S904: The DRAM refresh apparatus generates addresses of to-be-refreshed bank rows in the to-be-refreshed block according to the identifier and the refresh information.

Step S906: The DRAM refresh apparatus refreshes locations corresponding to the addresses of the bank rows in the to-be-refreshed block.

Optionally, the refresh information includes first indication information and second indication information. The first indication information is used to indicate a to-be-refreshed block row in the to-be-refreshed block, and the second indication information is used to indicate a to-be-refreshed bank row.

The DRAM refresh apparatus may receive the refresh instruction using the control interface 102 and the address interface 104 that are shown in FIG. 1, receive an instruction identifier using the control interface 102, and receive the identifier of the block and the refresh information using the address interface 104. The instruction identifier is used to indicate that the instruction is a refresh instruction.

That the DRAM refresh apparatus refreshes locations corresponding to the addresses of the bank rows in the to-be-refreshed block includes refreshing, by the DRAM refresh apparatus in N refresh stages according to a quantity M of to-be-refreshed block rows in the to-be-refreshed block, the locations corresponding to the addresses of the bank rows, where locations, in a same block row, of the locations are refreshed in parallel in a same refresh stage, M is a positive integer greater than 0, and N is a positive integer greater than 0 and less than or equal to M.

Figure 10:
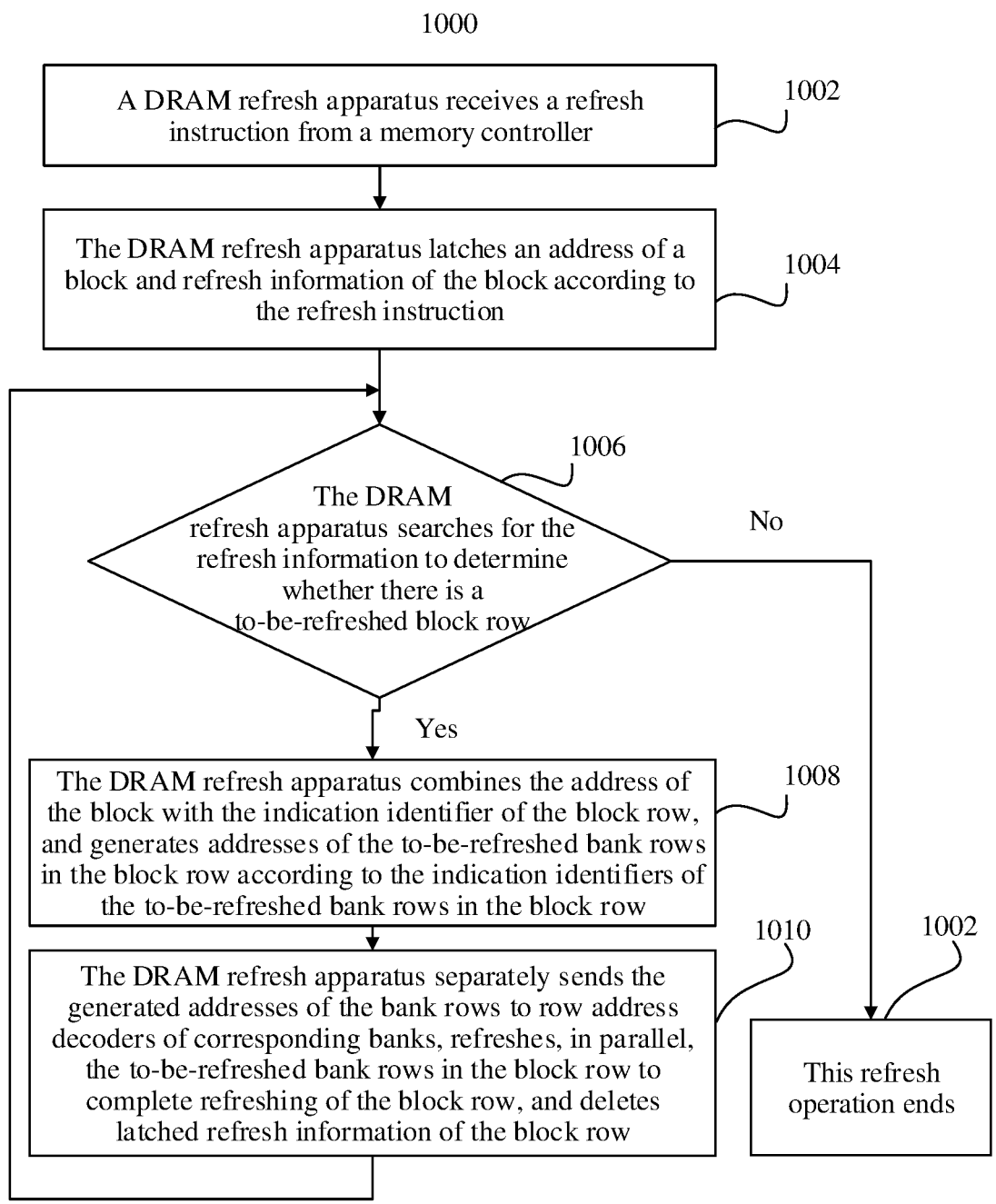
FIG. 10 is an example of a flowchart of a DRAM refresh method according to an embodiment of the present disclosure.

In a possible implementation manner, a specific flowchart of a method 1000 is shown in FIG. 10 and includes the following steps.

Step 1002: A DRAM refresh apparatus receives a refresh instruction from a memory controller, where the refresh instruction includes an address of a to-be-refreshed block and refresh information of the block, and the refresh information includes an indication identifier of a to-be-refreshed block row, and indication identifiers of to-be-refreshed bank rows in the to-be-refreshed block row.

Step 1004: The DRAM refresh apparatus latches the address of the block and the refresh information of the block according to the refresh instruction.

Step 1006: The DRAM refresh apparatus searches for the refresh information to determine whether there is a to-be-refreshed block row, and if there is a to-be-refreshed block row, performs step 1008, or if there is no to-be-refreshed block row, performs step 1012 to end this refresh operation.

Optionally, the DRAM refresh apparatus queries, according to address orders of block rows, whether there is a to-be-refreshed block row.

Step 1008: The DRAM refresh apparatus combines the address of the block with the indication identifier of the block row, and generates addresses of the to-be-refreshed bank rows in the block row according to the indication identifiers of the to-be-refreshed bank rows in the block row.

Step 1010: The DRAM refresh apparatus separately sends the generated addresses of the bank rows to row address decoders of corresponding banks, refreshes, in parallel, the to-be-refreshed bank rows in the block row to complete refreshing of the block row, and deletes latched refresh information of the block row and returns to step 1006.

Optionally, the refresh information further includes a row combination identifier used to instruct the DRAM refresh apparatus to refresh at least two block rows in the to-be-refreshed block in a same refresh stage, M is a positive integer greater than 0, and N is a positive integer greater than 0 and less than M.

Optionally, the refresh information further includes a termination identifier, and the termination identifier is used to instruct the DRAM refresh apparatus to terminate refreshing of the to-be-refreshed block after the indicated block row is refreshed. The method 1000 further includes terminating, by the DRAM refresh apparatus, the refreshing of the to-be-refreshed block according to the termination identifier.

Optionally, the refresh information further includes a suspension identifier, and the suspension identifier is used to instruct the DRAM refresh apparatus to suspend refreshing of the to-be-refreshed block after the indicated block row is refreshed. The method 1000 further includes suspending, by the DRAM refresh apparatus, the refreshing of the to-be-refreshed block according to the suspension identifier. The method 1000 further includes resuming, by the DRAM refresh apparatus, the suspended refreshing of the to-be-refreshed block, and continuing to refresh a remaining to-be-refreshed block row.

Figure 11:
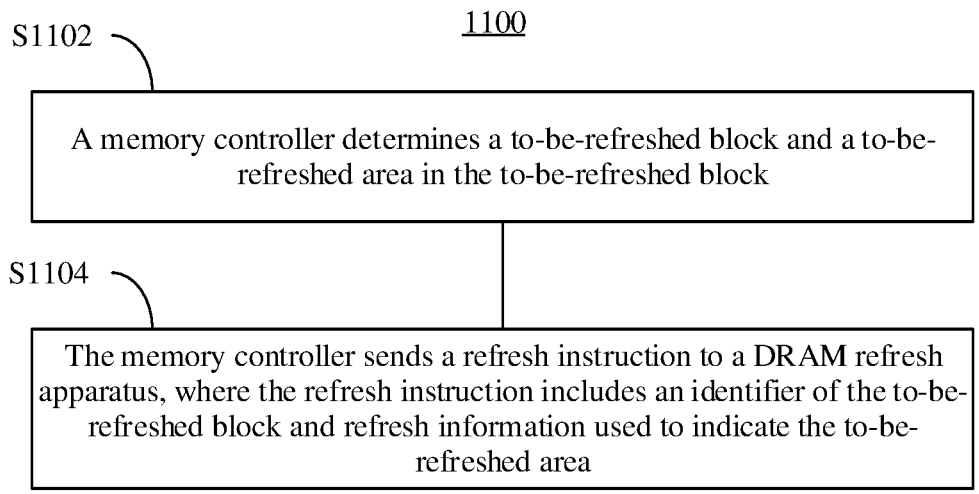
FIG. 11 is an example of a flowchart of a DRAM refresh method according to an embodiment of the present disclosure.

FIG. 11 is an example of a flowchart of a DRAM refresh method 1100 according to an embodiment of the present disclosure. A DRAM storage array includes at least two banks, a row of the DRAM storage array includes bank rows corresponding to the at least two banks, the DRAM storage array is divided into at least two refresh blocks, and each block includes multiple rows of the DRAM storage array. As shown in FIG. 11, the method 1100 includes the following steps.

Step S1102: A memory controller determines a to-be-refreshed block and a to-be-refreshed area in the to-be-refreshed block.

The memory controller maintains refresh-operation-related information of the DRAM storage array and configured to determine the to-be-refreshed block and the to-be-refreshed area in the to-be-refreshed block according to the refresh-operation-related information. The to-be-refreshed area may include a to-be-refreshed block row in the to-be-refreshed block, and to-be-refreshed bank rows in the to-be-refreshed block row.

Optionally, the refresh-operation-related information includes whether a storage unit of the storage array stores data and/or a keeping time of a storage unit. A bank row without data may not be refreshed, a storage unit with a long keeping time may be refreshed at a relatively low refresh frequency, and a storage unit with a short keeping time may be refreshed at a relatively high refresh frequency. Therefore, a DRAM refresh operation can be more properly configured, a DRAM refresh time is shortened, refresh power consumption is reduced, a refresh operation is more flexible, and system resource consumption is reduced while data integrity is ensured.

Step S1104: The memory controller sends a refresh instruction to a DRAM refresh apparatus, where the refresh instruction includes an identifier of the to-be-refreshed block and refresh information used to indicate the to-be-refreshed area.

Optionally, the refresh information includes first indication information and second indication information. The first indication information is used to indicate a to-be-refreshed block row in the to-be-refreshed block, and the second indication information is used to indicate a to-be-refreshed bank row.

Optionally, the refresh information further includes a row combination identifier used to instruct the DRAM refresh apparatus to refresh, in parallel, at least two block rows in the to-be-refreshed block in a same refresh stage.

Optionally, the refresh information further includes a termination identifier, and the termination identifier is used to instruct the DRAM refresh apparatus to terminate refreshing of the to-be-refreshed block after the indicated block row is refreshed.

Optionally, the refresh information further includes a suspension identifier, and the suspension identifier is used to instruct the DRAM refresh apparatus to suspend refreshing of the to-be-refreshed block after the indicated block row is refreshed.

Figure 12:
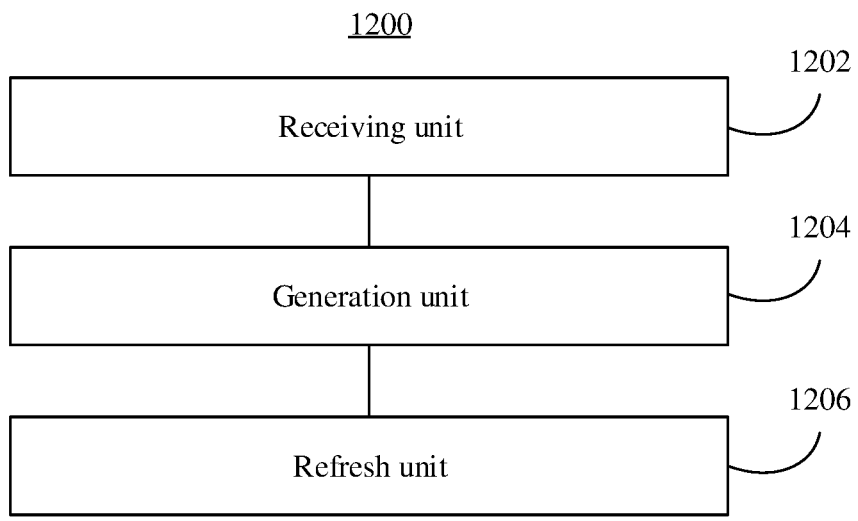
FIG. 12 is a schematic diagram of a logical structure of a DRAM refresh apparatus according to an embodiment of the present disclosure.

FIG. 12 is a schematic diagram of a logical structure of a DRAM refresh apparatus 1200 according to an embodiment of the present disclosure. A DRAM storage array includes at least two banks, a row of the DRAM storage array includes bank rows corresponding to the at least two banks, the DRAM storage array is divided into at least two refresh blocks, and each block includes multiple rows of the DRAM storage array. The DRAM refresh apparatus 1200 is shown in FIG. 12. The DRAM refresh apparatus 1200 may include a receiving unit 1202, a generation unit 1204, and a refresh unit 1206.

The receiving unit 1202 is configured to receive a refresh instruction from a memory controller, where the refresh instruction includes an identifier of a to-be-refreshed block and refresh information used to indicate a to-be-refreshed area, and the refresh instruction is used to instruct the DRAM refresh apparatus 1200 to refresh the to-be-refreshed area in the to-be-refreshed block.

The generation unit 1204 is configured to generate addresses of to-be-refreshed bank rows in the to-be-refreshed block according to the identifier and the refresh information.

The refresh unit 1206 is configured to refresh locations corresponding to the addresses of the bank rows in the to-be-refreshed block.

Optionally, the refresh information includes first indication information and second indication information. The first indication information is used to indicate a to-be-refreshed block row in the to-be-refreshed block, and the second indication information is used to indicate a to-be-refreshed bank row.

The receiving unit 1202 may receive the refresh instruction using the control interface 102 and the address interface 104 that are shown in FIG. 1, receive an instruction identifier using the control interface 102, and receive the identifier of the block and the refresh information using the address interface 104. The instruction identifier is used to indicate that the instruction is a refresh instruction.

Refreshing the locations corresponding to the addresses of the bank rows in the to-be-refreshed block includes refreshing, by the refresh unit 1206, in N refresh stages according to a quantity M of to-be-refreshed block rows in the to-be-refreshed block, the locations corresponding to the addresses of the bank rows, where locations, in a same block row, of the locations are refreshed in parallel in a same refresh stage, M is a positive integer greater than 0, and N is a positive integer greater than 0 and less than or equal to M.

Optionally, the refresh information further includes a row combination identifier used to instruct the refresh unit 1206 to refresh at least two block rows in the to-be-refreshed block in a same refresh stage, M is a positive integer greater than 0, and N is a positive integer greater than 0 and less than M.

Refreshing the to-be-refreshed block according to the addresses of the to-be-refreshed bank rows further includes combing and refreshing, by the refresh unit 1206, the at least two to-be-refreshed block rows according to an instruction of the row combination identifier, and refreshing, in parallel, to-be-refreshed bank rows in the at least two to-be-refreshed block rows in one refresh stage.

Optionally, the refresh information further includes a termination identifier, and the termination identifier is used to instruct the refresh unit 1206 to terminate refreshing of the to-be-refreshed block after the indicated block row is refreshed. The refresh unit 1206 is further configured to terminate the refreshing of the to-be-refreshed block according to the termination identifier.

Optionally, the refresh information further includes a suspension identifier, and the suspension identifier is used to instruct the refresh unit 1206 to suspend refreshing of the to-be-refreshed block after the indicated block row is refreshed. The refresh unit 1206 is further configured to suspend the refreshing of the to-be-refreshed block according to an instruction of the suspension identifier. The refresh unit 1206 is further configured to resume suspended refreshing of the to-be-refreshed block, and continue to refresh a remaining to-be-refreshed block row.

Figure 13:
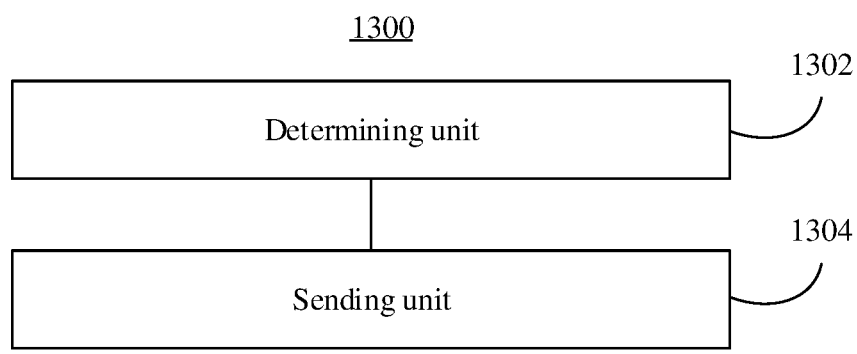
FIG. 13 is a schematic diagram of a logical structure of a DRAM refresh control apparatus according to an embodiment of the present disclosure.

FIG. 13 is a schematic diagram of a logical structure of a DRAM refresh control apparatus 1300 according to an embodiment of the present disclosure. A DRAM storage array includes at least two banks, a row of the DRAM storage array includes bank rows corresponding to the at least two banks, the DRAM storage array is divided into at least two refresh blocks, and each block includes multiple rows of the DRAM storage array. The DRAM refresh control apparatus 1300 is shown in FIG. 13. The DRAM refresh control apparatus 1300 may include a determining unit 1302 and a sending unit 1304.

The determining unit 1302 is configured to determine a to-be-refreshed block and a to-be-refreshed area in the to-be-refreshed block.

The sending unit 1304 is configured to send a refresh instruction to the DRAM refresh apparatus, where the refresh instruction includes an identifier of the to-be-refreshed block and refresh information used to indicate the to-be-refreshed area.

Optionally, the refresh information includes first indication information and second indication information. The first indication information is used to indicate a to-be-refreshed block row in the to-be-refreshed block, and the second indication information is used to indicate a to-be-refreshed bank row.

Optionally, the refresh information further includes a row combination identifier used to instruct the DRAM refresh apparatus to refresh, in parallel, at least two block rows in the to-be-refreshed block in a same refresh stage.

Optionally, the refresh information further includes a termination identifier, and the termination identifier is used to instruct the DRAM refresh apparatus to terminate refreshing of the to-be-refreshed block after the indicated block row is refreshed.

Optionally, the refresh information further includes a suspension identifier, and the suspension identifier is used to instruct the DRAM refresh apparatus to suspend refreshing of the to-be-refreshed block after the indicated block row is refreshed.

In the several embodiments provided in this application, it should be understood that the disclosed system, device, and method may be implemented in other manners. For example, the described apparatus embodiments are only examples. For example, the module division is only logical function division and may be other division in actual implementation. For example, multiple modules or components may be combined or integrated into another system, or some features may be ignored or not performed. In addition, the displayed or discussed mutual couplings or direct couplings or communication connections may be implemented using some interfaces. The indirect couplings or communication connections between the apparatuses or modules may be implemented in an electronic form, a mechanical form, or another form.

The modules described as separate parts may or may not be physically separate, and parts displayed as modules may or may not be physical modules, that is, may be located in one position, or may be distributed on multiple network modules. Some or all of the modules may be selected according to actual needs to achieve the objectives of the solutions of the embodiments.

In addition, function modules in the embodiments of the present disclosure may be integrated into one processing module, or each of the modules may exist alone physically, or two or more modules may be integrated into one module. The integrated module may be implemented in a form of hardware, or may be implemented in a form of hardware in addition to a software function module.

The foregoing integrated module implemented in a form of a software function module may be stored in a computer readable storage medium. The software function module is stored in a storage medium, and includes several instructions for instructing a computer device (which may be a personal computer, a server, a network device, or the like) to perform some steps of the methods described in the embodiments of the present disclosure. The foregoing storage medium includes any medium that can store program code, such as a removable hard disk, a read-only memory (ROM), a random access memory (RAM), a magnetic disk, or an optical disc.

Finally, it should be noted that the foregoing embodiments are only intended for describing the technical solutions of the present disclosure, but not for limiting the present disclosure. Although the present disclosure is described in detail with reference to the foregoing embodiments, persons of ordinary skill in the art should understand that they may still make modifications to the technical solutions described in the foregoing embodiments or make equivalent replacements to some technical features thereof, without departing from the protection scope of the technical solutions of the embodiments of the present disclosure.

What is claimed is:

1. A dynamic random access memory (DRAM) refresh method, comprising:
receiving, by a DRAM refresh apparatus, a refresh instruction from a memory controller, wherein the refresh instruction comprises an identifier of a to-be-refreshed block of a DRAM storage array, refresh information indicating a to-be-refreshed area, and an identifier of a not to-be-refreshed block of the DRAM storage array, wherein the DRAM storage array comprises at least two banks, wherein a row of the DRAM storage array comprises bank rows corresponding to the at least two banks, wherein the DRAM storage array is divided into at least two refresh blocks, and wherein each refresh block comprises at least two rows of the DRAM storage array;
generating, by the DRAM refresh apparatus, addresses of to-be-refreshed bank rows in the to-be-refreshed block of the DRAM storage array according to the identifier of the to-be-refreshed block of the DRAM storage array, the refresh information indicating the to-be-refreshed area, and the identifier of the not to-be-refreshed block of the DRAM storage array; and
refreshing, by the DRAM refresh apparatus, locations corresponding to the addresses of the to-be-refreshed bank rows in the to-be-refreshed block of the DRAM storage array.

2. The DRAM refresh method of claim 1, wherein the refresh information comprises a two-dimensional array of information, and wherein the refresh information further comprises first indication information indicating a to-be-refreshed block row in the to-be-refreshed block of the DRAM storage array and second indication information indicating a to-be-refreshed bank row.

3. The DRAM refresh method of claim 1, wherein refreshing the locations corresponding to the addresses of the bank rows in the to-be-refreshed block of the DRAM storage array comprises refreshing, by the DRAM refresh apparatus in N refresh stages according to a quantity of to-be-refreshed block rows in the to-be-refreshed block (M), the locations corresponding to the addresses of the to-be-refreshed bank rows, wherein locations, in a same block row, of the locations are refreshed in parallel in a same refresh stage, wherein M is a positive integer greater than 0, and wherein N is a positive integer greater than 0 and less than or equal to M.

4. The DRAM refresh method of claim 3, wherein the refresh information further comprises a row combination identifier instructing the DRAM refresh apparatus to refresh at least two block rows in the to-be-refreshed block in a same refresh stage, and wherein N is less than M.

5. The DRAM refresh method of claim 1, wherein the refresh information further comprises a termination identifier instructing the DRAM refresh apparatus to terminate refreshing of the to-be-refreshed block after an indicated block row is refreshed, and wherein the method further comprises terminating, by the DRAM refresh apparatus, the refreshing of the to-be-refreshed block according to the termination identifier.

6. The DRAM refresh method of claim 1, wherein the refresh information further comprises a suspension identifier instructing the DRAM refresh apparatus to suspend refreshing of the to-be-refreshed block after an indicated block row is refreshed, and wherein the method further comprises suspending, by the DRAM refresh apparatus, the refreshing of the to-be-refreshed block according to the suspension identifier.

7. The DRAM refresh method of claim 6, further comprising:
resuming, by the DRAM refresh apparatus, the suspended refreshing of the to-be-refreshed block; and
continuing to refresh a remaining to-be-refreshed block row.

8. A dynamic random access memory (DRAM) refresh method, comprising:
determining, by a memory controller, a to-be-refreshed block of a DRAM storage array and a to-be-refreshed area in the to-be-refreshed block, wherein the DRAM storage array comprises at least two banks, wherein a row of the DRAM storage array comprises bank rows corresponding to the at least two banks, wherein the DRAM storage array is divided into at least two refresh blocks, and wherein each refresh block comprises at least two rows of the DRAM storage array; and
sending, by the memory controller, a refresh instruction to a DRAM refresh apparatus, wherein the refresh instruction comprises an identifier of the to-be-refreshed block, refresh information indicating the to-be-refreshed area, and an identifier of a not to-be-refreshed block of the DRAM storage array.

9. The DRAM refresh method of claim 8, wherein the refresh information comprises a two-dimensional array of information, and wherein the refresh information further comprises first indication information indicating a to-be-refreshed block row in the to-be-refreshed block and second indication information indicating a to-be-refreshed bank row.

10. The DRAM refresh method of claim 8, wherein the refresh information further comprises a row combination identifier instructing the DRAM refresh apparatus to refresh, in parallel, at least two block rows in the to-be-refreshed block in a same refresh stage.

11. A dynamic random access memory (DRAM) refresh apparatus, comprising:
a memory configured to store program instructions;
an interface coupled the memory; and
a processor coupled to the memory and the interface, wherein the program instructions cause the processor to be configured to:
receive, through the interface, a refresh instruction from a memory controller, wherein the refresh instruction comprises an identifier of a to-be-refreshed block of a DRAM storage array, refresh information indicating a to-be-refreshed area, and an identifier of a not to-be-refreshed block of the DRAM storage array, wherein the DRAM storage array comprises at least two banks, wherein a row of the DRAM storage array comprises bank rows corresponding to the at least two banks, wherein the DRAM storage array is divided into at least two refresh blocks, and wherein each refresh block comprises at least two rows of the DRAM storage array;
generate addresses of to-be-refreshed bank rows in the to-be-refreshed block according to the identifier of the to-be-refreshed block of the DRAM storage array, the refresh information indicating the to-be-refreshed area, and the identifier of the not to-be-refreshed block of the DRAM storage array; and
refresh locations corresponding to the addresses of the to-be-refreshed bank rows in the to-be-refreshed block.

12. The DRAM refresh apparatus of claim 11, wherein the refresh information comprises a two-dimensional array of information, and wherein the refresh information further comprises first indication information indicating a to-be-refreshed block row in the to-be-refreshed block and second indication information indicating a to-be-refreshed bank row.

13. The DRAM refresh apparatus of claim 11, wherein the program instructions further cause the processor to be configured to refresh, in N refresh stages according to a quantity of to-be-refreshed block rows in the to-be-refreshed block (M), the locations corresponding to the addresses of the to-be-refreshed bank rows, wherein locations, in a same block row, of the locations are refreshed in parallel in a same refresh stage, wherein M is a positive integer greater than 0, and wherein N is a positive integer greater than 0 and less than or equal to M.

14. The DRAM refresh apparatus of claim 13, wherein the refresh information further comprises a row combination identifier instructing the processor to refresh at least two block rows in the to-be-refreshed block in a same refresh stage, and wherein N is less than M.

15. The DRAM refresh apparatus of claim 11, wherein the refresh information further comprises a termination identifier instructing the processor to terminate refreshing of the to-be-refreshed block after an indicated block row is refreshed, and wherein the program instructions further cause the processor to be configured to terminate the refreshing of the to-be-refreshed block according to the termination identifier.

16. The DRAM refresh apparatus of claim 11, wherein the refresh information further comprises a suspension identifier instructing the processor to suspend refreshing of the to-be-refreshed block after an indicated block row is refreshed, and wherein the program instructions further cause the processor to be configured to suspend the refreshing of the to-be-refreshed block according to the suspension identifier.

17. The DRAM refresh apparatus of claim 16, wherein the program instructions further cause the processor to be configured to:
resume the suspended refreshing of the to-be-refreshed block; and
continue to refresh a remaining to-be-refreshed block row.

18. A dynamic random access memory (DRAM) chip, comprising:
a DRAM storage array comprising at least two banks, wherein a row of the DRAM storage array comprises bank rows corresponding to the at least two banks, wherein the DRAM storage array is divided into at least two refresh blocks, and wherein each refresh block comprises at least two rows of the DRAM storage array; and
a DRAM refresh apparatus coupled to the DRAM storage array and configured to:
receive a refresh instruction from a memory controller, wherein the refresh instruction comprises an identifier of a to-be-refreshed block, refresh information indicating a to-be-refreshed area, and an identifier of a not to-be-refreshed block of the DRAM storage array;
generate addresses of to-be-refreshed bank rows in the to-be-refreshed block according to the identifier of the to-be-refreshed block of the DRAM storage array, the refresh information indicating the to-be-refreshed area, and the identifier of the not to-be-refreshed block of the DRAM storage array; and refresh locations corresponding to the addresses of the to-be-refreshed bank rows in the to-be-refreshed block.

19. The DRAM chip of claim 18, wherein the refresh information comprises a two-dimensional array of information, and wherein the refresh information further comprises first indication information indicating a to-be-refreshed block row in the to-be-refreshed block and second indication information indicating a to-be-refreshed bank row.

20. A dynamic random access memory (DRAM) refresh system, comprising:
   a memory controller;
   a DRAM refresh apparatus coupled to the memory controller; and
   a DRAM storage array coupled to the memory controller and the DRAM refresh apparatus,
   wherein the DRAM storage array comprises at least two banks,
   wherein a row of the DRAM storage array comprises bank rows corresponding to the at least two banks,
   wherein the DRAM storage array is divided into at least two refresh blocks,
   wherein each refresh block comprises at least two rows of the DRAM storage array,
   wherein the memory controller is configured to:
      determine a to-be-refreshed block and a to-be-refreshed area in the to-be-refreshed block; and
      send a refresh instruction to the DRAM refresh apparatus, wherein the refresh instruction comprises an identifier of the to-be-refreshed block, refresh information indicating the to-be-refreshed area, and an identifier of a not to-be-refreshed block of the DRAM storage array,
   wherein the DRAM refresh apparatus is configured to:
      generate addresses of to-be-refreshed bank rows in the to-be-refreshed block according to the identifier of the to-be-refreshed block of the DRAM storage army, the refresh information indicating the to-be-refreshed area, and the identifier of the not to-be-refreshed block of the DRAM storage array; and
      refresh locations corresponding to the addresses of the to-be-refreshed bank rows in the to-be-refreshed block.

* * * * *

UNITED STATES PATENT AND TRADEMARK OFFICE
CERTIFICATE OF CORRECTION

PATENT NO. : 10,586,608 B2
APPLICATION NO. : 15/802781
DATED : March 10, 2020
INVENTOR(S) : Shihai Xiao, Yongbing Huang and Rui He Page 1 of 1

It is certified that error appears in the above-identified patent and that said Letters Patent is hereby corrected as shown below:

Claim 20, Column 24, Line 16: "army, the refresh" should read "array, the refresh"

Signed and Sealed this
Nineteenth Day of May, 2020

Andrei Iancu
*Director of the United States Patent and Trademark Office*